(12) United States Patent
Schamberger et al.

(10) Patent No.: US 6,320,368 B1
(45) Date of Patent: Nov. 20, 2001

(54) METHOD FOR DETERMINING THE DRIVE CAPABILITY OF A DRIVER CIRCUIT OF AN INTEGRATED CIRCUIT

(75) Inventors: Florian Schamberger, Bad Reichenhall; Helmut Schneider, München, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/401,387

(22) Filed: Sep. 22, 1999

(30) Foreign Application Priority Data

Sep. 22, 1998 (DE) .............................. 198 43 432

(51) Int. Cl.⁷ .................................. G01R 31/28
(52) U.S. Cl. ............................................ 324/111
(58) Field of Search .................... 324/111, 119, 324/130, 132, 662, 73.1, 158.1, 268; 327/14, 306, 109, 170, 270, 65, 334; 714/724; 340/664

(56) References Cited

U.S. PATENT DOCUMENTS

| | | | |
|---|---|---|---|
| 3,289,079 | * 11/1966 | Ferguson | 324/111 |
| 3,465,248 | * 9/1969 | Thiele | 324/111 |
| 5,185,538 | 2/1993 | Kondoh . | |
| 5,198,760 | * 3/1993 | Farwell | 714/724 |
| 5,477,173 | * 12/1995 | Schlesselmann et al. | 327/560 |
| 5,497,105 | * 3/1996 | Oh et al. | 327/268 |

FOREIGN PATENT DOCUMENTS

69300009T2  11/1993  (DE) .

* cited by examiner

Primary Examiner—Vinh P. Nguyen
(74) Attorney, Agent, or Firm—Herbert L. Lerner; Laurence A. Greenberg; Werner H. Stemer

(57) ABSTRACT

A method provides that, when a driver circuit is deactivated, a first capacitor disposed at an output of the driver circuit is placed at a first potential. The driver circuit is then activated at a first point in time, so that a current flows between its output and the first capacitor. The flow of current between the output of the driver circuit and the first capacitor is interrupted at a second point in time and the potential at the first capacitor is subsequently determined as a measure of the drive capability of the driver circuit.

5 Claims, 3 Drawing Sheets

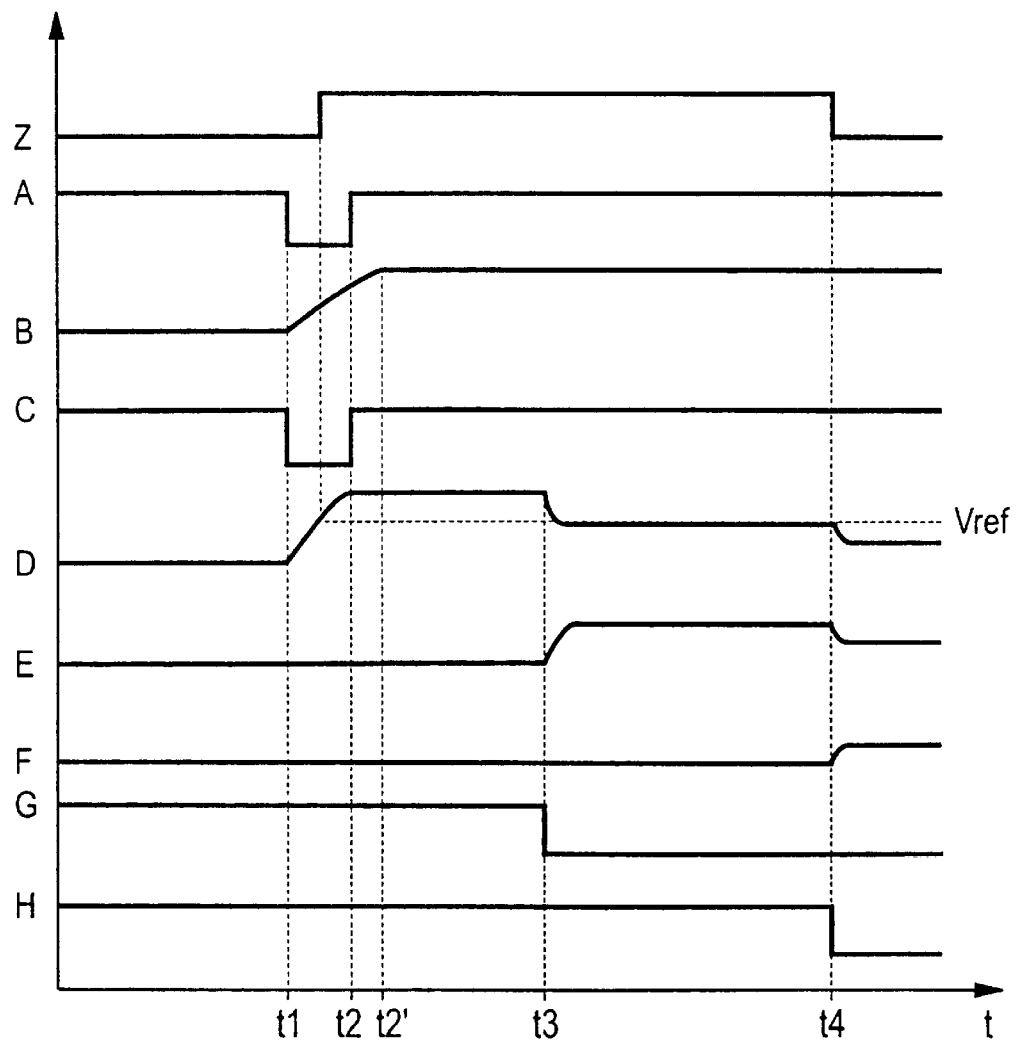

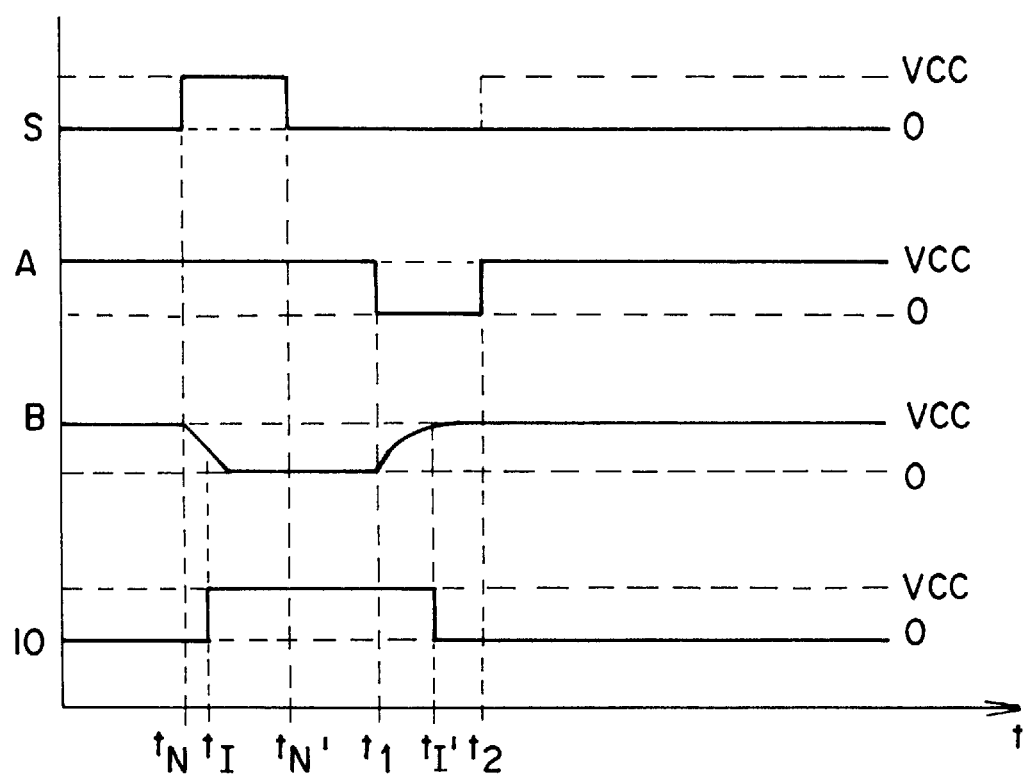

METHOD FOR DETERMINING THE DRIVE CAPABILITY OF A DRIVER CIRCUIT OF AN INTEGRATED CIRCUIT

BACKGROUND OF THE INVENTION

FIELD OF THE INVENTION

The invention relates to a method for determining the driver capability of a driver circuit of an integrated circuit.

Driver capability is understood here in what follows as the capability of the driver to supply a specific current within a specific period of time. A possible way of determining the driver capability of a driver circuit is to use a current measuring device to measure the current driven by it. However, current measuring devices require a relatively high degree of expenditure on hardware.

SUMMARY OF THE INVENTION

It is accordingly an object of the invention to provide a method for determining the drive capability of a driver circuit of an integrated circuit, which overcomes the above-mentioned disadvantages of the prior art methods of this general type, which can be implemented with little hardware expenditure, for determining the driver capability of a driver circuit of an integrated circuit.

With the foregoing and other objects in view there is provided, in accordance with the invention, a method for determining a drive capability of a driver circuit of an integrated circuit, which includes: deactivating the driver circuit and placing a capacitor disposed at an output of the driver circuit at a first potential; activating the driver circuit at a first point in time so that current flows between the output and the capacitor; interrupting the current flowing between the output of the driver circuit and the capacitor at a second point in time; and determining subsequently a potential at the capacitor as a measure of the drive capability of the driver circuit.

The method according to the invention provides that, when a driver circuit is deactivated, a first capacitor at the output of the driver circuit is placed at a first potential. The driver circuit is activated at a first point in time, so that a current flows between its output and the first capacitor, but the flow of current between the output of the driver circuit and the first capacitor is interrupted at a second point in time and that the potential at the first capacitor is subsequently determined as a measure of the driver capability of the driver circuit.

Instead of the direct measurement of the current that has flowed from the driver circuit between the first and second point in time, in the invention the potential at the first capacitor is determined. Since the potential has been placed at the known, first potential before the first point in time, the difference between the potentials at the first capacitor after the second and before the first point in time is proportional to the charge which has flowed, and thus to the current which has flowed. This results from the equation Q=C*U given a capacitance which is assumed to be constant, and from $$C = \frac{dQ}{dt} = C * \frac{dU}{dt}.$$

Here, the change in charge dQ is proportional to the current that has flowed. Since the first capacitance is assumed to be known, and the period of time between the first and the second points in time is also known, it is therefore possible to determine the driver capability of the driver circuit by determining the potential after the second point in time at the first capacitor.

According to one development of the invention, the potential of the first capacitor is determined by an evaluation unit connected to it. Therefore, the driver capability is determined by components that are located on the integrated circuit, so that an external testing device is not required for this. The internal evaluation unit of the integrated circuit can subsequently supply, for example, a corresponding result signal to outside the integrated circuit, the signal indicating whether the driver capability that has been determined exceeds or drops below a previously defined limiting value. According to one development, the driver circuit has a first switching element that is disposed in a main current path, connected to it at the output, of the driver circuit and which has a first, relatively long switching time, and the output of the driver circuit is connected to the first capacitor via a second switching element which has a second switching time which is relatively short in comparison with the first switching time.

Here, the second switching element is energized at the latest at the first point in time and is switched off precisely at the second point in time, so that the flow of current between the output of the driver circuit and the first capacitor is interrupted. Here, "switching time" is understood to be the time within which the switching element is completely switched off starting from the conductive state by an appropriate control signal.

Since the first switching element is disposed in the main current path of the driver circuit, its slow switching behavior decisively influences the switching behavior of the driver circuit. Using the comparatively quickly switching, second switching element ensures that the flow of current between the output of the driver circuit and the first capacitor is interrupted relatively quickly as a result of the second switching element switching off at the second point in time. If, on the other hand, it was desired to interrupt the flow of current by switching off the first switching element, its slow switching behavior would only result in the first switching element being switched off with a delay relative to the latter, after a corresponding control signal has assumed a deactivated level. The first and second switching elements may, for example, be transistors to whose control terminals appropriate control signals can be applied. A transistor with a relatively long switching time is obtained if the width to length ratio of its main current path assumes a high value. Conversely, a relatively short switching time is obtained if the width to length ratio of a transistor assumes a relatively small value. Using the second switching element makes it possible to interrupt the flow of current between the output of the driver circuit and the first capacitor even if the first switching element and thus the driver circuit are still driving a current.

According to one development, the first capacitor is connected to a second capacitor via a third switching element. The third switching element is switched off at the latest at the first point in time and is energized at a third point in time that occurs after the second point in time. The potential of the first capacitor is determined a first time before the third point in time and a second time after the third point in time as a measure of the driver capability of the driver circuit.

In this way, it is possible to determine both before and after the third point in time whether the potential at the first capacitor exceeds or drops below a predefined limiting value. Since, after the third point in time, the second capacitor is disposed parallel with the first capacitor, a capacitive voltage divider is obtained, as a result of which charge flows from the first capacitor to the second capacitor, or vice-versa. As a result, the potential of the first capacitor changes and it is also possible subsequently to determine on which side of the predefined limiting value it lies. With further, corresponding switching elements, it is possible to switch further capacitors in parallel with the first and second capacitors at later points in time. After each further capacitor has been connected into the circuit, it is then possible to determine again the potential at the first capacitor and a comparison can be made with the predefined limiting value. In the manner described it is possible to determine the driver capability of the driver circuit relatively precisely although only a single evaluation unit or comparison circuit with a single permanently set reference value is required for the respective comparison of the potential of the first capacitor with a predefined limiting value.

According to one development, a load which is connected to the output of the driver circuit is activated between the first and second points in time, so that the change in the potential at the first capacitor which is brought about by the current driven by the driver circuit is slowed down. The load can be formed here, for example, by a transistor via which a current of known strength flows in the active state. The additional load causes the current supplied by the driver circuit to be divided. Part of the current flows via the load while only the other part of the current serves to charge the first capacitor. In this way, the time that is necessary to charge the first capacitor can be prolonged. As a result, the time period between the first and second points in time, during which period the potential at the first capacitor is determined can be selected to be longer than if the additional load were not present without the first capacitor being completely charged even before the second point in time.

Basically, it is favorable for the execution of the method according to the invention if the first capacitor is not yet completely charged before the second point in time. This is important because, after the complete charging of the first capacitor, additional charge can no longer be taken up, and for this reason it is not possible for the current to flow between the output of the driver circuit and the capacitor. Thus, when the first capacitor is already completely charged it is not possible to determine the driver capability of the driver circuit.

Although the explanations above relate to the case in which the driver circuit drives a positive current to charge the first capacitor, the invention is of course also capable of being applied to driver circuits which drive a negative current by which the first capacitor is discharged between the first and second points in time.

Other features which are considered as characteristic for the invention are set forth in the appended claims.

Although the invention is illustrated and described herein as embodied in a method for determining the drive capability of a driver circuit of an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTIONS OF THE DRAWINGS

FIG. 3 is a timing diagram of signal profiles relating to the exemplary embodiment according to FIG. 2; and FIG. 4 is a timing diagram of signal profiles relating to the exemplary embodiment from FIG. 1.

DESCRIPTION OF THE PREFERRED EMBODIMENTS

Figure 1:
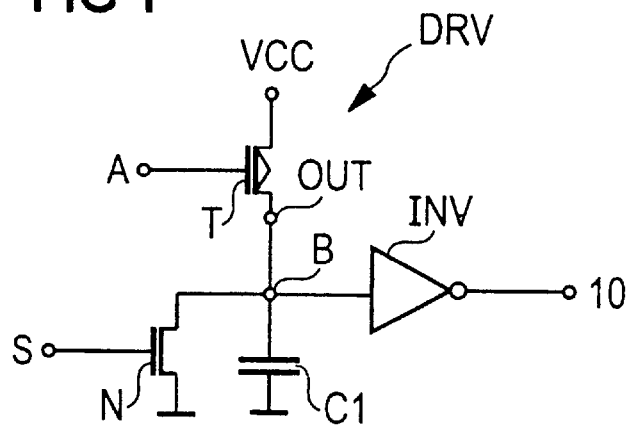
FIG. 1 is a diagrammatic, circuit diagram of a first exemplary embodiment according to the invention.

In all the figures of the drawing, sub-features and integral parts that correspond to one another bear the same reference symbol in each case. Referring now to the figures of the drawing in detail and first, particularly, to FIG. 1 thereof, there is shown a detail of an integrated circuit which has a driver circuit DRV with an output OUT between a positive supply potential VCC and a circuit node B. The driver circuit DRV is formed by a driver transistor T of the p-channel type. Its control input is connected to a control signal A. The circuit node B is connected to ground via an n-channel type transistor N, and a control terminal of which is connected to a control signal S. The circuit node B is also connected to ground via a first capacitor C1. The first capacitor C1 can either be formed by a capacitor which is provided by circuitry or by a parasitic capacitance of leads which are connected to the output OUT of the driver circuit DRV. Furthermore, the circuit node B is connected via an inverter INV to an external port 10 of the integrated circuit. The inverter INV is an evaluation unit of the integrated circuit.

FIG. 4 shows signal profiles during the execution of the method according to the invention for determining the driver capability of the driver circuit DRV or its driver transistor T. Firstly, the driver transistor T and the n-channel type transistor N are switched off. At a point in time tN, the control signal S of the n-channel type transistor N has a positive edge, as a result of which the transistor is energized (conducting). Then, the circuit node B, or the first capacitor C1 connected to it, discharges from a high level to a low level. At a point in time tI, the current drops below a switching threshold of the inverter INV, as a result of which a level change from the low level to the high level takes place at the external port 10. At a point in time tN', the control signal S has a negative edge, as a result of which the n-channel type transistor N which is connected to it is switched off again. At a first point in time T1, the control signal A of the driver transistor T has a negative edge, as a result of which the transistor T is energized. The driver transistor T then drives a current via its output OUT, which charges the first capacitor C1. For this reason, the potential at the circuit node B rises as shown in FIG. 4. At a second point in time t2, the control signal A has a positive edge, as a result of which the driver transistor T is switched off again. At this point in time, the first capacitor C1 is already charged virtually to the value of the supply potential VCC. Even before the second point in time t2, a switching threshold of the inverter INV was exceeded at a point in time tI', as a result of which in turn a level change from the high level to the low level occurs at the external port 10 of the integrated circuit.

At the external port 10, it is thus possible to detect from outside the integrated circuit whether the potential at the switching node B has risen beyond the switching threshold of the inverter INV within the time period between the first point in time t1 and the second point in time t2. If this switching threshold, which corresponds as it were to a limiting value, were not exceeded during this time period, this will demonstrate that the driver transistor T does not have the desired driver capability. It has been assumed here that the switching threshold of the inverter INV, the value of the first capacitor C1 and the length of the time period between the two points in time t1 and t2 are known.

In another exemplary embodiment of the invention, the n-channel type transistor N from FIG. 1 is not switched off at the point in time tN' by its control signal S. Instead, the control signal S remains at the positive level up to the second point in time t2. This is shown in FIG. 4 by a dotted line. Here, the n-channel type transistor N is given such small dimensions that, in comparison with the driver transistor T, it conducts a comparatively small current in the on state. Since its gate/source voltage is kept constant, the n-channel type transistor N forms a constant load that is connected in parallel with the first capacitor C1. As a result, it is possible to ensure that the rise in the potential of the circuit node B is slowed down between the first point in time t1 and the second point in time t2. Instead of dimensioning the n-channel type transistor N smaller than the driver transistor T, it can also have approximately the same dimensions. In order to be able to use it then as a constant load while the driver capability is being determined, it is then necessary to energize it just slightly via its control signal S, so that just a low load current flows. Given identical dimensioning of the driver transistor T and of the n-channel type transistor N, both may be, for example, part of a common output driver of the integrated circuit. Then, to implement the constant load current it is not necessary to have an additional component that is not required when the integrated circuit is operating normally. In addition, the driver capability of the n-channel type transistor N can then be tested in an equivalent way in that the driver transistor, as a p-channel type transistor, is then used as its constant load. In this way, it is possible, in two successive steps, to check firstly the driver capability of the p-channel type transistor T and subsequently the driver capability of the n-channel type transistor N of such a driver circuit.

Figure 2:
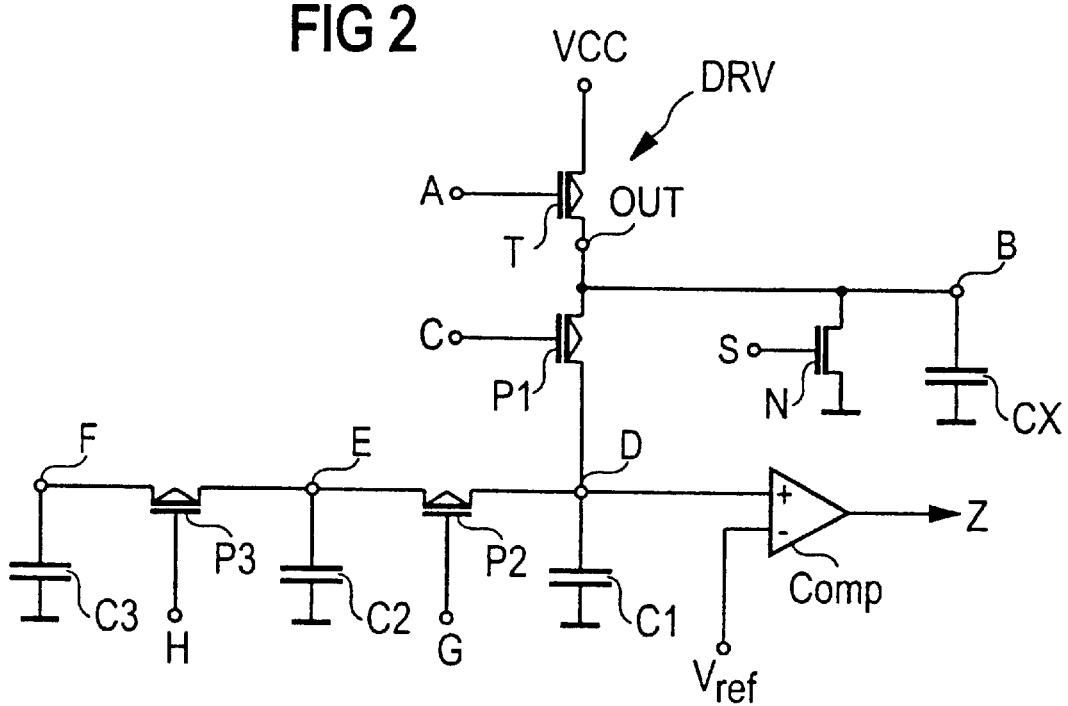
FIG. 2 is a circuit diagram of a second exemplary embodiment of the invention.

FIG. 2 shows a modification of the integrated circuit from FIG. 1. The driver circuit DRV with the driver transistor T is in turn disposed between the positive supply potential VCC and the circuit node B. The circuit node B is in turn connected to ground via the n-channel type transistor N. In addition, it is connected to ground via a capacitor CX. It is also connected to a circuit node D via a first p-channel type transistor P1. The circuit node D is connected to ground via the first capacitor C1 and to a circuit node E via a second p-channel type transistor P2. The circuit node E is connected to ground via a second capacitor C2 and to a circuit node F via a third p-channel type transistor P3, the circuit node F being connected to ground via a third capacitor C3. The circuit node D is also connected to an input of a comparator COMP, which is also connected to a reference potential Vref. The comparator COMP compares a potential at the circuit node D to the reference potential Vref and outputs an appropriate result signal Z to outside the integrated circuit.

FIG. 3 shows various signal profiles for the circuit from FIG. 2. FIG. 3 does not illustrate that all the capacitors CX, C1, C2, C3 are discharged to ground potential before a first point in time t1. This takes place as a result of simultaneous energization of the n-channel type transistor N, of the first p-channel type transistor P1, of the second p-channel type transistor P2 and of the third p-channel type transistor P3. Before the first point in time t1, all the transistors are switched off. At the first point in time t1, both the driver transistor T is energized via the control signal A, and the first p-channel type transistor P1 is energized via a control signal C. The circuit node B is then connected to the circuit node D, and for this reason the potential of these two nodes rises in the same way. The rise in potential is brought about by a current which is driven by the driver transistor T and which charges the parallel circuit of the capacitor CX and the first capacitor C1. At the second point in time t2, the control signals A, C of the driver transistor and of the first p-channel type transistor P1 have a positive edge. This causes the two transistors to switch off. However, the first p-channel type transistor P1 is dimensioned in such a way that it has a much shorter switching time than the driver transistor T. A short switching time is obtained by virtue of the selection of a low width to length ratio of the main current path of the MOS transistor. Conversely, a long switching time is obtained by virtue of the selection of a high width to length ratio. Owing to the shorter switching time of the first p-channel type transistor P1, the charging process of the first capacitor C1 is interrupted earlier than the charging process of the capacitor CX, since the driver transistor T still drives a current when the first p-channel type transistor P1 is already switched off.

The profile of the output signal Z of the comparator COMP from FIG. 2 is also shown in FIG. 3. As long as the potential at the circuit node D, which is connected to the first capacitor C1, is below the reference potential Vref, the output signal Z has a low level. As soon as the potential at the circuit node D exceeds the reference potential Vref, the output signal Z changes to a high level. In the case illustrated, the reference potential Vref has been exceeded even before the second point in time t2 at the circuit node D. As already explained, the first p-channel type transistor P1 switches off completely at the point in time t2, while the driver transistor T of the driver circuit DRV does not switch off completely until the point in time t2'. At a third point in time t3, the second p-channel type transistor P2 is energized by a control signal G, so that a charge equalization between the first capacitor C1 and the second capacitor C2 takes place. Accordingly, the potential at the circuit node D drops. According to FIG. 3, the potential at the circuit node D after the third point in time t3 does not drop below the reference potential Vref, so that the output signal Z retains its high level. According to a fourth point in time t4, at which the third p-channel type transistor P3 is energized by a control signal H, the further charge equalization results in a further dropping of the potential at the circuit node D. Since the potential now drops below the reference potential Vref, the output signal Z changes to a low level.

By monitoring the output signal Z of the comparator COMP after the second point in time t2, after the third point in time t3 and after the fourth point in time t4, it is possible to detect when the potential at the circuit node D drops below the reference potential Vref. In this way it is possible to evaluate the driver capability of the driver circuit DRV more precisely. For example it is possible to determine that the driver circuit DRV has a sufficient driver capability if the output signal Z has a high level up to the fourth point in time T4. However, it is also possible to determine that the driver capability is sufficient if the output signal Z has a high level at least up to the third point in time t3. In the present exemplary embodiment, the driver capability is in all cases evaluated as being insufficient if the potential at the circuit node D does not exceed the reference potential Vref at the second point in time t2.

The provision of the second capacitor C2 and of the third capacitor C3 and their sequential connection into the circuit at the third point in time t3 and at the fourth point in time t4 make it possible to determine more precisely the potential to which the circuit node D has been charged at the second point in time t2 by the current driven by the driver circuit DRV. Nevertheless, to carry out this evaluation just one single comparator COMP is required, to which a single, constant reference potential Vref is fed.

In other exemplary embodiments of the invention it is, of course, also possible to connect more than two further capacitors C2, C3 sequentially in parallel with the first capacitor C1.

In a refinement of the exemplary embodiment according to FIG. 1, the inverter INV that is shown there can also be replaced by a comparator, as shown in FIG. 2. The comparator COMP and the inverter INV are internal evaluation units of the integrated circuit.

We claim:

1. A method for determining a drive capability of a driver circuit of an integrated circuit, which comprises:

deactivating the driver circuit and placing a capacitor disposed at an output of the driver circuit at a first potential;

activating the driver circuit at a first point in time so that current flows between the output and the capacitor;

interrupting the current flowing between the output of the driver circuit and the capacitor at a second point in time; and determining subsequently a potential at the capacitor as a measure of the drive capability of the driver circuit.

2. The method according to claim 1, which comprises determining the potential at the capacitor with an evaluation unit connected to the capacitor.

3. The method according to claim 1, which comprises:

providing the driver circuit with a first switching element having a first switching time and connected to the output in a main current path;

providing a second switching element having a second switching time that is relatively short in comparison with the first switching time, the second switching element connecting the output of the driver circuit to the capacitor;

energizing the second switching element at a latest at the first point in time; and switching off the second switching element precisely at the second point in time so that the current flowing between the output of the driver circuit and the capacitor is interrupted.

4. The method according to claim 3, which comprises:

providing a further capacitor and a third switching element, the capacitor is connected to the further capacitor via the third switching element;

switching off the third switching element at a latest at the first point in time and energizing the third switching element at a third point in time that occurs after the second point in time; and determining the potential of the capacitor a first time before the third point in time and a second time after the third point in time as a measure for the drive capability of the driver circuit.

5. The method according to claim 1, which comprises activating a load connected to the output of the driver circuit between the first point in time and the second point in time for slowing down a change in the potential at the capacitor which is brought about by the current driven by the driver circuit.

* * * * *